(12) United States Patent
Sato

(10) Patent No.: US 12,489,368 B2
(45) Date of Patent: Dec. 2, 2025

(54) HALF BRIDGE OVERCURRENT PROTECTION

(71) Applicant: RENESAS ELECTRONICS AMERICA INC., Milpitas, CA (US)

(72) Inventor: Tetsuo Sato, San Jose, CA (US)

(73) Assignee: RENESAS ELECTRONICS AMERICA INC., Milpitas, CA (US)

( * ) Notice: Subject to any disclaimer, the term of this patent is extended or adjusted under 35 U.S.C. 154(b) by 213 days.

(21) Appl. No.: 18/526,263

(22) Filed: Dec. 1, 2023

(65) Prior Publication Data

US 2025/0183799 A1    Jun. 5, 2025

(51) Int. Cl.
*H02M 1/088* (2006.01)
*H02M 3/158* (2006.01)

(52) U.S. Cl.
CPC ........... *H02M 3/158* (2013.01); *H02M 1/088* (2013.01)

(58) Field of Classification Search
CPC .............................. H02M 3/158; H02M 1/088
See application file for complete search history.

(56) References Cited

U.S. PATENT DOCUMENTS

| | | | |
|---|---|---|---|
| 9,397,657 B1* | 7/2016 | Zhao | H03K 17/127 |
| 9,722,581 B2* | 8/2017 | Zhao | H03K 17/122 |
| 12,294,356 B2* | 5/2025 | Udrea | H10D 84/401 |

* cited by examiner

*Primary Examiner* — Adolf D Berhane
(74) *Attorney, Agent, or Firm* — SCULLY, SCOTT, MURPHY & PRESSER, P.C.

(57) ABSTRACT

Apparatuses and circuits for overcurrent protection are described. A circuit can be connected to one of a first hybrid switching device and a second hybrid switching device in a half bridge circuit. The first hybrid switching device can include a first wide-bandgap (WBG) device and a first FET in a cascode arrangement. The first WBG device can have a higher breakdown voltage than the first FET and a larger band gap than the first FET. The second hybrid switching device can include a second hybrid switching device including a second WBG device and a second FET in a cascode arrangement. The second WBG device can have a higher breakdown voltage than the second FET and a larger band gap than the second FET. The circuit can monitor a drive current of the half bridge circuit for detecting an overcurrent condition of the half bridge circuit.

20 Claims, 10 Drawing Sheets

HALF BRIDGE OVERCURRENT PROTECTION

BACKGROUND OF THE SPECIFICATION

The present disclosure relates to power systems, and more particularly to overcurrent protection in power modules having half bridge circuits.

Wide bandgap semiconductor devices silicon carbide (SiC) and gallium nitride (GaN) devices are formed by semiconductor materials having relatively larger band gap than conventional semiconductors such as Silicon. Examples of wide bandgap devices can include, but not limited to, silicon carbide (SiC) and gallium nitride (GaN). In an aspect, Silicon semiconductors have a bandgap in the range of 0.6-1.5 electronvolt (eV), whereas wide-bandgap materials can have bandgaps in the range above 2 eV. Wide-bandgap semiconductors allow devices to operate at relatively higher voltages, frequencies, and temperatures than conventional semiconductor materials. Applications that can use wide bandgap devices include short-wavelength (green-UV) LEDs or lasers, radio frequency applications, military radars, or others.

SUMMARY

In one embodiment, an apparatus for overcurrent protection is generally described. The apparatus can include a half bridge circuit. The half bridge circuit can include a first hybrid switching device connected to an input voltage. The first hybrid switching device can include a first wide-bandgap (WBG) device and a first FET connected in a cascode arrangement. The first WBG device can have a higher breakdown voltage than the first FET and the first WBG device can have a larger band gap than the first FET. The half bridge circuit can further include a second hybrid switching device connected to ground. The second hybrid switching device can include a second WBG device and a second FET connected in a cascode arrangement. The second WBG device can have a higher breakdown voltage than the second FET and the second WBG device can have a larger band gap than the second FET. The apparatus can further include a circuit connected to one of the first hybrid switching device and the second hybrid switching device. The circuit can be configured to monitor a drive current of the half bridge circuit. The circuit can be further configured to detect an overcurrent condition of the half bridge circuit based on the monitored drive current.

In one embodiment, an apparatus for overcurrent protection is generally described. The apparatus can include a controller and a half bridge circuit. The half bridge circuit can include a first hybrid switching device connected to an input voltage. The first hybrid switching device can include a first wide-bandgap (WBG) device and a first FET connected in a cascode arrangement. The first WBG device can have a higher breakdown voltage than the first FET and the first WBG device can have a larger band gap than the first FET. The half bridge circuit can further include a second hybrid switching device connected to ground. The second hybrid switching device can include a second WBG device and a second FET connected in a cascode arrangement. The second WBG device can have a higher breakdown voltage than the second FET and the second WBG device can have a larger band gap than the second FET. The apparatus can further include a circuit connected to one of the first hybrid switching device and the second hybrid switching device. The circuit can be configured to monitor a drive current of the half bridge circuit. The circuit can be further configured to detect an overcurrent condition of the half bridge circuit based on the monitored drive current. The circuit can be further configured to generate a signal based on the monitored drive current. The signal can indicate whether an overcurrent condition of the half bridge circuit is present or absent. The circuit can be further configured to output the signal to the controller. The controller can be configured to control the half bridge circuit based on the signal.

In one embodiment, an apparatus for overcurrent protection is generally described. The apparatus can include a sense field effect transistor (FET) connected to a FET in a half bridge circuit. The half bridge circuit can include a first hybrid switching device and a second hybrid switching device. The first hybrid switching device can include a first wide-bandgap WBG device and a first FET connected in a cascode arrangement. The second hybrid switching device can include a second WBG device and a second FET connected in a cascode arrangement. The apparatus can further include a sample and hold circuit configured to sample a drain-source voltage of the FET. The sample and hold circuit can remove noise from the sampled drain-source voltage to output a hold voltage. The apparatus can further include a comparator configured to compare the hold voltage with a predefined threshold voltage. An output of the comparator can indicate whether a overcurrent condition is present or absent in the half bridge circuit.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
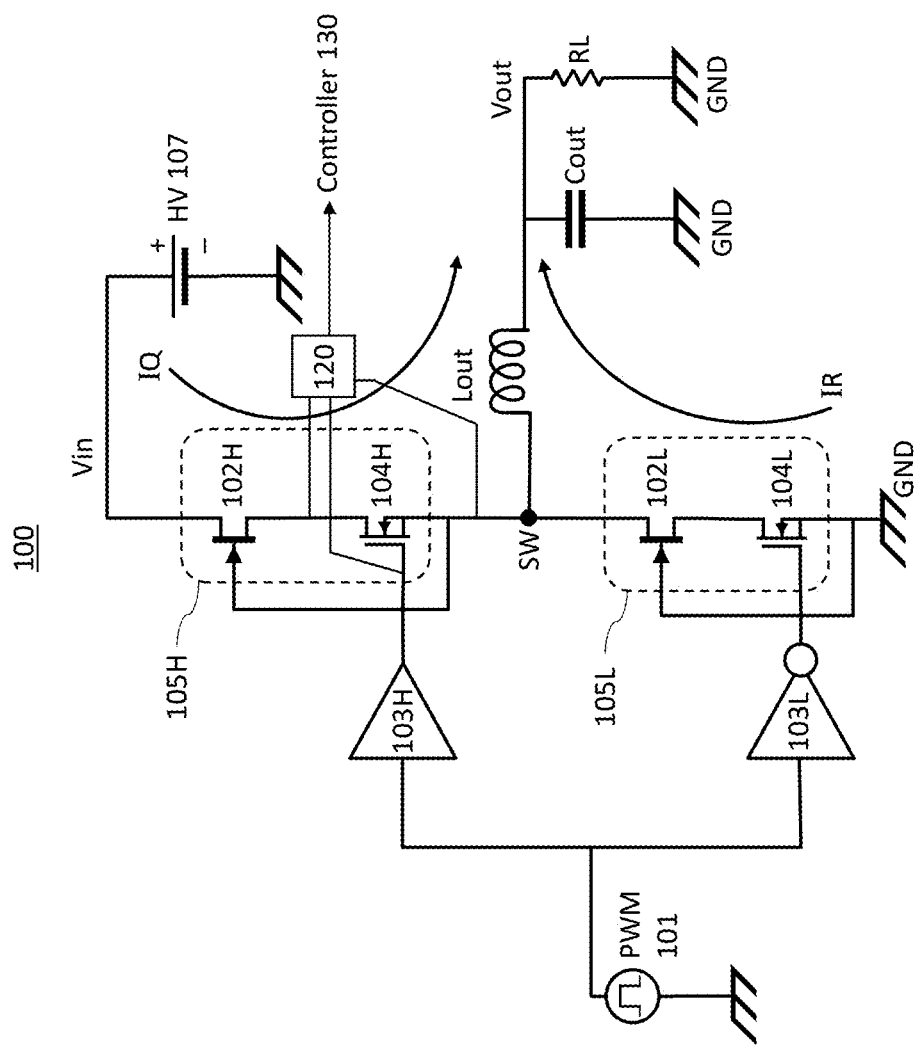
FIG. 1 is a diagram showing a voltage converter that can implement half bridge overcurrent protection in one embodiment.

FIG. 1 is a diagram showing a voltage converter that can implement half bridge overcurrent protection in one embodiment. Voltage converter 100 can include drivers 103H, 103L, a high-voltage supply HV 107, wide-bandgap (WBG) devices WBG devices 102H, 102L and silicon (Si) based metal-oxide-semiconductor field effect transistors (MOSFETs) 104H, 104L. Voltage converter 100 can be a step-down DC-DC converter, or a buck converter. Voltage converter 100 can convert high-voltage DC power into low-voltage DC power, where the high-voltage DC power can be provided by high-voltage supply HV 107. Voltage converter 100 can generate an output voltage Vout as a function of the input voltage Vin. A pulse width modulation (PWM) signal 101 can be provided to drivers 103H and 103L. Drivers 103H and 103L can output complementary signals to drive MOSFETs 104H and 104L. The complimentary signals are non-overlapping to prevent MOSFETs 104H and 104L from being turned on at the same time, such that current shoot-through from Vin to ground can be prevented. A load RL can be connected to a switch node SW between the HS and LS switches, and the load RL can receive power produced by Vout via an inductor L. In an aspect, one or more output capacitors, such as Cout, can be connected between inductor L and the load RL.

WBG device 102H and MOSFET 104H are cascade connected in a cascoded arrangement to form a hybrid switching device 105H. The gate of WBG device 102H is connected to the source of MOSFET 104H, and the source of WBG device 102H is connected to the drain of MOSFET 104H. WBG device 102L and MOSFET 104L are cascade connected in a cascoded arrangement to form a hybrid switching device 105L. The gate of WBG device 102L is connected to the source of MOSFET 104L, and the source of WBG device 102L is connected to the drain of MOSFET 104L. In one embodiment, MOSFETs 104H and 104L can be N-type metal-oxide-semiconductor (NMOS) devices made of silicon. WBG device 102H can have a higher breakdown voltage than MOSFET 104H, and WBG device 102L can have a higher breakdown voltage than MOSFET 104L.

In one embodiment, WBG devices 102H and 102L can be high-voltage devices such as transistors made of wide band-gap materials, such as SiC or GaN. WBG devices 102H, 102L can be, for example, silicon carbide (SiC) based junction field effect transistors (WBG devices) or GaN high electron mobility transistors (HEMTs). Hybrid switching devices 105H and 105L can form a half bridge circuit that converts Vin into Vout. The half bridge circuit formed by hybrid switching devices 105H and 105L can be implemented for applications and devices that utilizes relatively high voltage (e.g., more than 1 kilovolts (kV)) and relatively high switching frequency (e.g., up to 1 MHz). The half bridge circuit can be implemented for, for example, AC to DC converters, power factor correction (PFC) converter, isolated or non-isolated DC-DC converters, encoders, decoders, BLDC motor, AC motor driver, or other applications and devices.

MOSFET 104H can be an enhancement mode device and WBG device 102H can be a depletion mode device. WBG device 102H can be turned on when the voltage between its gate and source exceeds its threshold voltage. The hybrid switching device 105H can operate as an enhancement mode device, such that hybrid switching device 105H is turned on when a voltage applied between the gate and source of MOSFET 104H exceeds its threshold voltage, and hybrid switching device 105H turns off when zero voltage is applied between the gate and source of MOSFET 104H.

MOSFET 104L can be an enhancement mode device and WBG device 102L can be a depletion mode device. WBG device 102L can be turned on when the voltage between its gate and source exceeds its threshold voltage. The hybrid switching device 105L can operate as an enhancement mode device, such that hybrid switching device 105L is turned on when a voltage applied between the gate and source of MOSFET 104L exceeds its threshold voltage, and hybrid switching device 105L turns off when zero voltage is applied between the gate and source of MOSFET 104L. In addition to operating as an enhancement mode devices, which can be important in high voltage applications, hybrid switching devices 105H and 105L can provide high breakdown voltage, low thermal resistance, and other advantages.

When MOSFET 104H is turned on and MOSFET 104L is turned off, a drive current IQ can flow from HV 107 to a load RL through WBG device 102H, MOSFET 104H and inductor L.

When MOSFET 104L is turned on and MOSFET 104H is turned off, the inductor L needs to keep current flow out to the load RL. Hence, inductor current, or current of the inductor L can recirculate, causing a recirculation current IR to flow from L to the load RL. The recirculation current can be a reverse current, such as current that flows in a direction opposing the body diode of MOSFET 104L and Rdson of WBG device 102L.

The high voltage and high-speed switching provided by the half bridge circuit formed by hybrid switching devices 105H and 105L can reduce the size, weight and cost of transformer, choke coil and capacitor Cout for power converters. However, such high voltage, high power and high-speed devices may require precise control of current flowing through the devices to protect the switching devices or power supply system from being damaged by excessive current. The drive current IQ can depend on output voltage Vout and load current (e.g., current being drawn by load RL). Therefore, to control the current flowing through voltage converter 100, the output voltage Vout can be adjusted to change the drive current IQ and load current. Further, the excessive current can degrade a performance of the power converter. For example, excessive current going into inductor L can accumulate and increase ripple voltage. Further, the excessive current can introduce additional ringing and noise at the switch node SW.

To monitor drive current IQ in a buck converter, such as voltage converter 100, an overcurrent protection circuit 120 can be connected across MOSFET 104H and connected to the gate of MOSFET 104H. When MOSFET 104H is turned on, the gate voltage being used for turning on MOSFET 104H can be detected by overcurrent protection circuit 120 and the drive current IQ can be monitored by overcurrent protection circuit 120.

If driver current IQ exceeds a predefined threshold, the overcurrent protection circuit 120 can notify a controller 130 to adjust the PWM signal 101 for reducing drive current IQ and output voltage Vout. The overcurrent protection circuit 120 can use a double sampling system to eliminate the PWM switching noise and can sample the 104H drain-source voltage Vds, which can be a product of drain-source current Ids and RDS(on), in a cycle-by-cycle manner (e.g., in each PWM cycle). If Vds exceeds a predefined voltage threshold, then the overcurrent protection circuit 120 can hold the Vds constant at a holding voltage and notify a controller of voltage converter 100. The controller 130 can take specific actions to address the overcurrent condition. By way of example, the controller 130 can terminate the driving function that drives drive current IQ to Vout, then use a decay circuit to reduce the holding voltage and start driving Vds at a level lower than the predefined voltage threshold. The overcurrent protection circuit 120 can control the output voltage Vout to be relatively close a target voltage that complies with a safety level of drive current IQ. Further, the overcurrent protection circuit 120 can also provide a smooth waveform of the output power. Furthermore, the overcurrent protection circuit 120 can be implemented as a separated from voltage converter 100.

In an aspect, when overcurrent condition occurs, the 102H Vds can vary from Vin to saturation voltage in response to Vds switching on or off, which can be a relatively wide range of 800V~1V. Therefore, the effect of ringing can be strong and noisy, and the accuracy of conventional overcurrent protection scheme is reduced. However, the overcurrent protection circuit 120 described herein monitors the device (e.g., MOSFET 104H or MOSFET 104L) with the an off mode drain-source voltage (Vds) of MOSFET 104H being equivalent to the gate-source voltage (Vgs) of WBG device 102H, where the threshold voltage (Vth) of WBG device 102H can be approximately 15V and the voltage from Vth to on mode of WBG device 102 is approximately 0.2V. Therefore, the change in Vds during switching on or off can maintain at a ratio of approximately 15V/800V=1/53, which means it can take less ringing noise in Vds(sat) voltage to detect Ids. Thus, the accuracy of overcurrent protection is improved when compared with conventional schemes.

Figure 2:
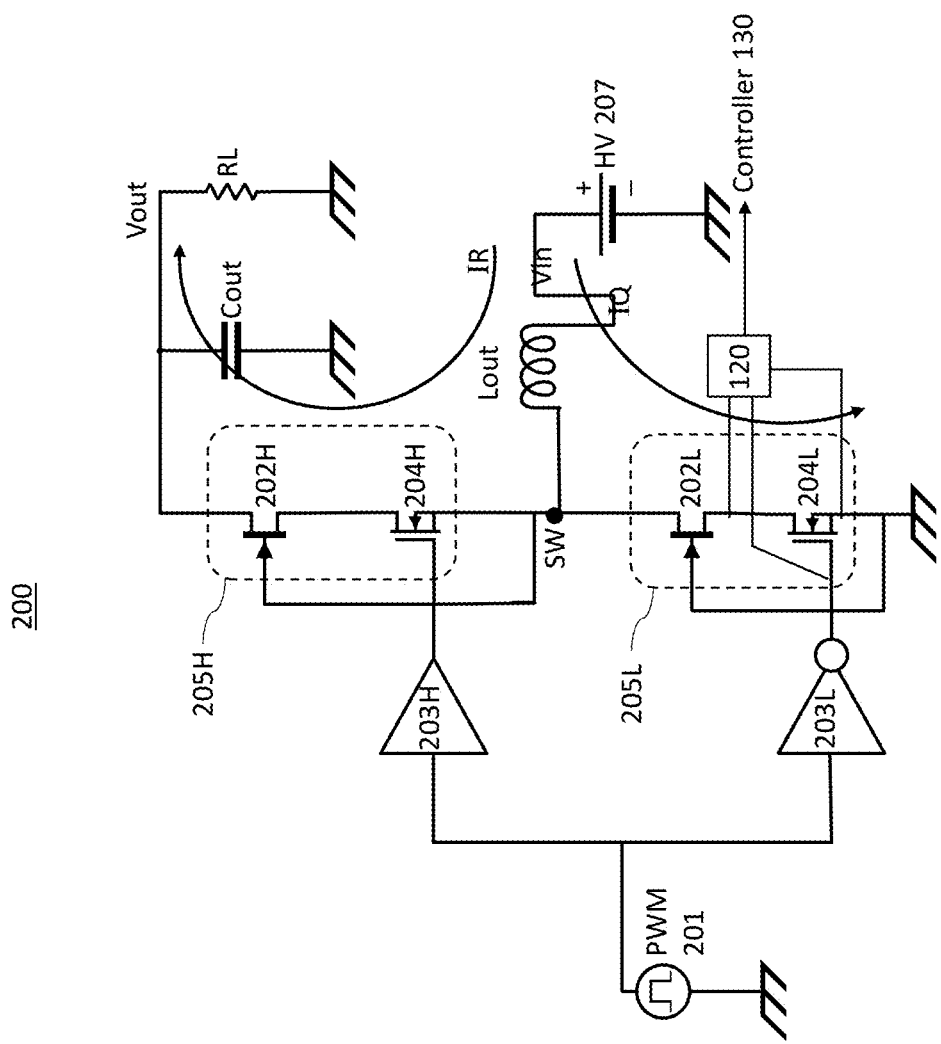
FIG. 2 is a diagram showing another voltage converter that can implement half bridge overcurrent protection in one embodiment.

FIG. 2 is a diagram showing another voltage converter that can implement half bridge overcurrent protection in one embodiment. Voltage converter 200 can include drivers 203H, 203L, a high-voltage supply HV 207, WBG devices 202H, 202L and silicon (Si) based metal-oxide-semiconductor field effect transistors (MOSFETs) 204H, 204L. Voltage converter 200 can be a step-up DC-DC converter, or a boost converter. Voltage converter 200 can convert input DC power into a higher voltage DC power, where the input DC power can be provided by high-voltage supply HV 207. Voltage converter 200 can generate an output voltage Vout as a function of the input voltage Vin. A pulse width modulation (PWM) signal 201 can be provided to drivers 203H and 203L. Drivers 203H and 203L can output complementary signals to drive MOSFETs 204H and 204L. The complimentary signals are non-overlapping to prevent MOSFETs 204H and 204L from being turned on at the same time, such that current shoot-through from Vin to ground can be prevented. A load RL can be connected to WBG device 202H and the load RL can receive power produced by Vout.

In an aspect, one or more output capacitors, such as Cout, can be connected between WBG device 202H and the load RL.

WBG device 202H and MOSFET 204H are cascade connected in a cascoded arrangement to form a hybrid switching device 205H. The gate of WBG device 202H is connected to the source of MOSFET 204H, and the source of WBG device 202H is connected to the drain of MOSFET 204H. WBG device 202L and MOSFET 204L are cascade connected in a cascoded arrangement to form a hybrid switching device 205L. The gate of WBG device 202L is connected to the source of MOSFET 204L, and the source of WBG device 202L is connected to the drain of MOSFET 204L. In one embodiment, MOSFETs 204H and 204L can be N-type metal-oxide-semiconductor (NMOS) devices made of silicon.

In one embodiment, WBG devices 202H and 202L can be high-voltage devices such as transistors made of wide band-gap materials, such as SiC or GaN. Hybrid switching devices 205H and 205L can form a half bridge circuit that converts Vin into Vout. The half bridge circuit formed by hybrid switching devices 205H and 205L can be implemented for applications and devices that utilizes relatively high voltage (e.g., more than 1 kilovolts (kV)) and relatively high switching frequency (e.g., up to 1 MHz). The half bridge circuit can be implemented for, for example, AC to DC converters, PFC, isolated or non-isolated DC-DC converters, encoders, decoders, BLDC motor, AC motor driver, or other applications and devices.

MOSFET 204H can be an enhancement mode device and WBG device 202H can be a depletion mode device. WBG device 202H can be turned on when the voltage between its gate and source exceeds its threshold voltage. The hybrid switching device 205H can operate as an enhancement mode device, such that hybrid switching device 205H is turned on when a voltage applied between the gate and source of MOSFET 204H exceeds its threshold voltage, and hybrid switching device 205H turns off when zero voltage is applied between the gate and source of MOSFET 204H.

MOSFET 204L can be an enhancement mode device and WBG device 202L can be a depletion mode device. WBG device 202L can be turned on when the voltage between its gate and source exceeds its threshold voltage. The hybrid switching device 205L can operate as an enhancement mode device, such that hybrid switching device 205L is turned on when a voltage applied between the gate and source of MOSFET 204L exceeds its threshold voltage, and hybrid switching device 205L turns off when zero voltage is applied between the gate and source of MOSFET 204L. In addition to operating as an enhancement mode devices, which can be important in high voltage applications, hybrid switching devices 205H and 205L can provide high breakdown voltage, low thermal resistance, and other advantages.

When MOSFET 204L is turned on and MOSFET 204H is turned off, a drive current IQ can flow from HV 207 to ground GND through inductor L, WBG device 202L and MOSFET 204L. When MOSFET 204H is turned on and MOSFET 204L is turned off, the inductor L needs to keep current flow out to the load RL. Hence, inductor current, or current of the inductor L can recirculate, causing a recirculation current IR to flow from L to the load RL through WBG device 202H and MOSFET 204H. The recirculation current can be a reverse current, such as current that flows in a direction opposing the body diode of MOSFET 204H and the on resistance (Rdson) of WBG device 202H.

The high voltage and high-speed switching provided by the half bridge circuit formed by hybrid switching devices 205H and 205L can reduce the size, weight and cost of transformer, choke coil and capacitor for power converters. However, such high voltage, high power and high-speed devices may require precise control of current flowing through the devices to protect the switching devices or power supply system from being damaged by excessive current. The drive current IQ can depend on output voltage Vout and load current (e.g., current being drawn by load RL). Therefore, to control the current flowing through voltage converter 200, the output voltage Vout can be adjusted to change the drive current IQ and load current. Further, the excessive current can degrade a performance of the power converter. For example, excessive current going into inductor L can accumulate and increase ripple voltage. Further, the excessive current can introduce additional ringing and noise at the switch node SW.

To monitor drive current IQ in a boost converter, such as voltage converter 200, the overcurrent protection circuit 120 can be connected across MOSFET 204L and connected to the gate of MOSFET 204L. When MOSFET 204L is turned on, the gate voltage being used for turning on MOSFET 204L can be detected by overcurrent protection circuit 120 and the drive current IQ can be monitored by overcurrent protection circuit 120.

If driver current IQ exceeds a predefined threshold, the overcurrent protection circuit 120 can notify a controller 230 to adjust the PWM signal 201 for reducing drive current IQ and output voltage Vout. The overcurrent protection circuit 120 can use a double sampling system to eliminate the PWM switching noise and can sample the drain-source voltage Vds of the MOSFET being monitored (e.g., MOSFET 204L), which can be a product of drain-source current Ids and RDS(on), in a cycle-by-cycle manner (e.g., in each PWM cycle). If Vds exceeds a predefined voltage threshold, then the overcurrent protection circuit 120 can hold the Vds constant at a holding voltage and notify a controller of voltage converter 200. The controller 230 can take specific actions to address the overcurrent condition. By way of example, the controller 230 can terminate the driving function that drives drive current IQ to Vout, then use a decay circuit to reduce the holding voltage and start driving Vds at a level lower than the predefined voltage threshold. The overcurrent protection circuit 120 can control the output voltage Vout to be relatively close a target voltage that complies with a safety level of drive current IQ. Further, the overcurrent protection circuit 120 can also provide a smooth waveform of the output power. Furthermore, the overcurrent protection circuit 120 can be implemented as a separated from voltage converter 200.

In an aspect, when overcurrent condition occurs, the 202L Vds can vary from Vin to saturation voltage in response to Vds switching on or off, which can be a relatively wide range of 800V~1V. Therefore, the effect of ringing can be strong and noisy, and the accuracy of conventional overcurrent protection scheme is reduced. However, the overcurrent protection circuit 120 described herein monitors the device (e.g., MOSFET 104H or MOSFET 104L) with the an off mode drain-source voltage (Vds) of MOSFET 204L being equivalent to the gate-source voltage (Vgs) of WBG device 202L, where the threshold voltage (Vth) of WBG device 102L can be approximately 15V and the voltage from Vth to on mode of WBG device 102L is approximately 0.2V. Therefore, the change in Vds during switching on or off can maintain at a ratio of approximately 15V/800V=1/53, which means it can take less ringing noise in Vds(sat) voltage to detect Ids. WBG device 102 WBG device 102 Thus, the accuracy of overcurrent protection is improved when compared with conventional schemes.

Figure 3:
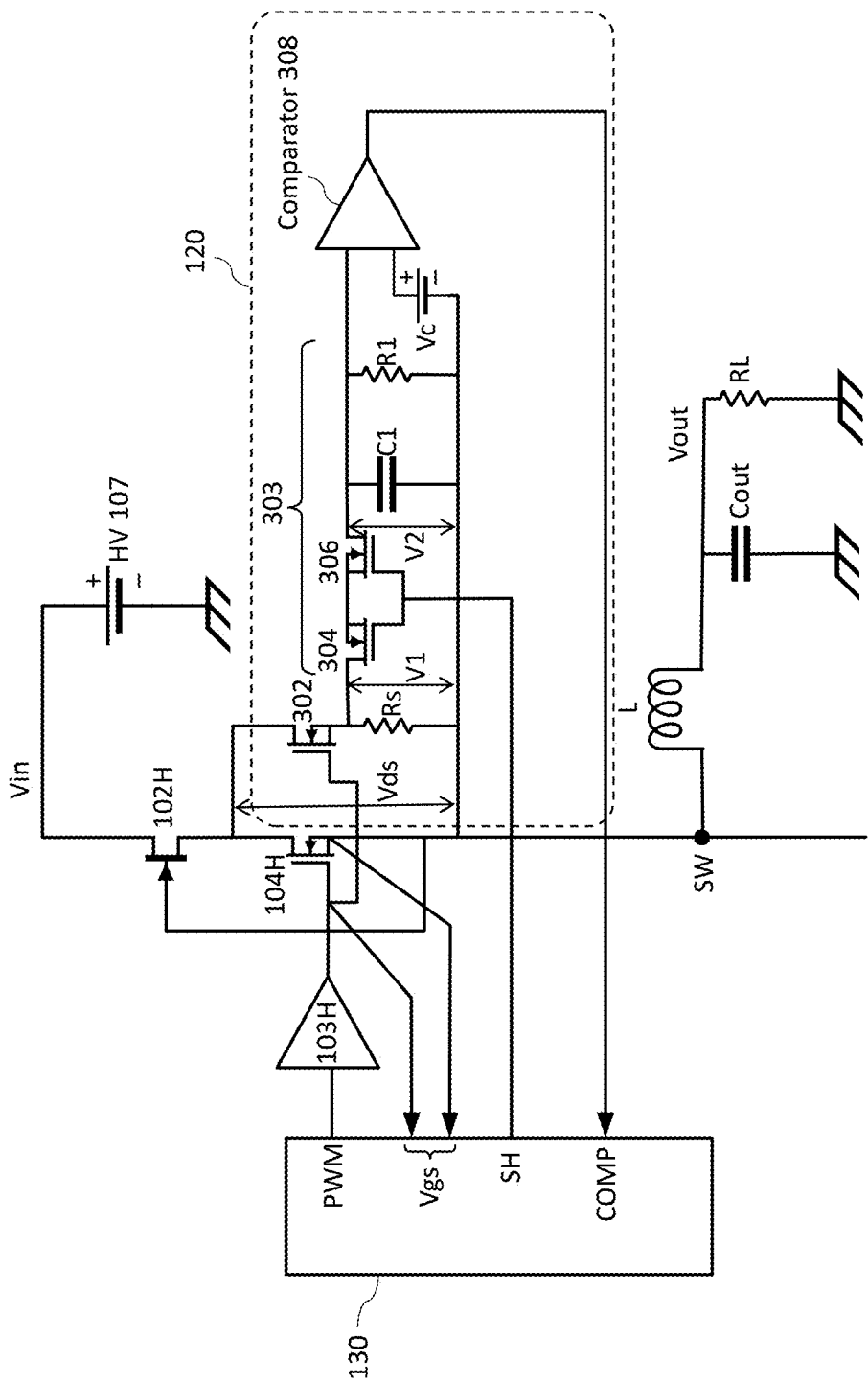
FIG. 3 is a diagram showing an implementation of half bridge overcurrent protection in one embodiment.

FIG. 3 is a diagram showing an implementation of half bridge overcurrent protection in one embodiment. Details of overcurrent protection circuit 120 are shown in FIG. 3. FIG. 3 also shows an embodiment where overcurrent protection circuit 120 is implemented for a step down converter, or a buck converter, such as voltage converter 100 shown in FIG. 1. In one embodiment, overcurrent protection circuit 120 can include a MOSFET 302, a switch 304, a switch 306, a sense resistor Rs, a capacitor C1, a resistor R1, a voltage source providing a predefined threshold voltage Vc and a comparator 308. A size of MOSFET 302 can be smaller than a size of MOSFET 104H. In one embodiment, MOSFET 302 can be approximately 10 to 100 times smaller than MOSFET 104H. and MOSFET 302 can turn ON/OFF in the same timing. When turn ON, the Vds, which is the product of the RDSon of MOSFET 104H and drain-source current (Ids) of MOSFET 104H, is transferred to V1 because the Vds of WBG device 102H is relatively small (e.g., very close to zero).

As shown in FIG. 1, WBG device 102H and MOSFET 104H forms hybrid switching device 105H. WBG device 102H can function as a high voltage blocker for hybrid switching device 105H and ON/OFF switching of hybrid switching device 105H is controlled by MOSFET 104H. When MOSFET 104H is turned on, hybrid switching device 105H is also turned on and a drain-source voltage Vds of MOSFET 104H is a product of drain-source current Ids of MOSFET 104H and a drain-source on resistance (RDS(on)) of MOSFET 104H (e.g., Vds=Ids×RDS(on)). In one embodiment, Vds can be several tens of millivolts (mV). In one embodiment, when MOSFET 104H is turned off, the threshold voltage Vth of WBG device 102H can be approximately 15V.

MOSFET 302 can be used for monitoring the ON Vds of MOSFET 104H (e.g., Vds when MOSFET 104H is turned on). The gate of MOSFET 302 is connected to the gate of MOSFET 104H and the output of driver 103H. Thus, when MOSFET 104H is turned on, MOSFET 302 is turned on as well. MOSFET 302 can be parallel to MOSFET 104H, where MOSFET 302 can implement an analog switch for detecting RDS(on) saturation voltage, and for transferring the saturation Vds into voltage V1.

In one embodiment, MOSFET 302 and MOSFET 104H can be mounted on separate dies. In another embodiment, MOSFET 302 and MOSFET 104H can be integrated on the same die. If MOSFET 302 and MOSFET 104H are integrated on the same die, then the detected Vds voltage can be easier to be transferred to V1 without noise voltage generated by high current switching of WBG device 102L and MOSFET 104L. The MOSFET 302 and MOSFET 104H being on different dies or the same die can be dependent on a desired implementation of voltage converter 100.

Sense resistor Rs can be connected between the source of MOSFET 302 and switch node SW. Sense resistor Rs can transfer the saturation Vds at MOSFET 302 to a voltage V1. In an aspect, the voltage V1 can be the ON Vds voltage of MOSFET 104H (e.g., several tens of mV) without the OFF Vds voltage (e.g., 15V). Switch 304 can be connected to the source of MOSFET 302 and switch 306 can be connected between switch 304 and capacitor C1. Switches 304, 306, capacitor C1 and resistor R1 can form a second sample and hold circuit 303.

In an aspect, the voltage V1 can include switching noise produced from the transition of MOSFET 104H from an off state to an on state. After MOSFET 302 sampled V1, the sample and hold circuit 303 can perform a second sampling to sample a voltage V2. In one embodiment, the sample timing of V1 (e.g., switching times of MOSFET 302 being controlled by controller 130) can control switches 304 and 306 in sample and hold circuit 303 to transfer V1 to V2 as a hold voltage. This hold voltage can represent an ON current of MOSFET 104H and WBG device 102H. Sampling of the voltage V2 can reject the switching noise present in the voltage V1 such that the sampled voltage V2 can have the same voltage as V1 without switching noise. MOSFET 302 and the sample and hold circuit 303 can perform double sampling that includes a first sampling of V1 and a second sampling of V2. The sample and hold circuit 303 can be controlled by controller 130. Switches 304 and 306 can be various types of switches. In one embodiment, switches 304, 306 being connected back to back in sample and hold circuit 303 can eliminate the current path formed through the body diodes of switches 304, 306.

In one embodiment, switches 304, 306 can be MOSFETs or WBG devices, and controller 130 can send a control signal labeled as SH to the gates of switches 304, 306 to turn on or turn off switches 304, 306. In one embodiment, feedback lines can connect the gate and source of MOSFET 104H to controller 130 such that controller 130 can measure the gate-source voltage Vgs of MOSFET 104H. The gate-source voltage Vgs measured by controller 130 can indicate whether MOSFET 104H is turned on or turned off. In response to controller 130 measuring Vgs and the measured Vgs indicates that MOSFET 104H is turned on, controller 130 can send control signal SH to turn on switches 304 and 306.

Voltage V2 and predefined threshold voltage Vc can be inputted into a comparator 308. Comparator 308 can output a signal COMP to controller 130. In one embodiment, the signal COMP can be a binary signal there a first binary value (e.g., binary zero) can indicate V2 is less than Vc and a second binary value (e.g., binary one) can indicate V2 is greater than Vc. By way of example, when RDS(on) of MOSFET 104H is divided by the predefined threshold voltage Vc (e.g., Vc/RDS(on)), the dividend can be a predefined threshold current that can be compared with drive current IQ to determine whether there is an overcurrent condition. Changes to Vc can change the predefined current threshold. Also, when RDS(on) of MOSFET 104H is divided by V2 (e.g., V2/RDS(on)), the dividend can be the drive current IQ. Therefore, V2 being less than Vc can indicate that the drive current IQ is less than a predefined current threshold and thus there is no overcurrent condition. V2 being greater than Vc can indicate that the drive current IQ is greater than the predefined current threshold and thus an overcurrent condition has occurred.

In response to V2 being greater than Vc indicating that the overcurrent condition has occurred, controller 130 can turn off MOSFET 104H, switches 304, 306 to hold the sampled voltage V2 between switch 306 and comparator 308. The capacitor C1 and resistor R1 can form a decay circuit that gradually decreases the voltage V2 being held. As the voltage V2 gradually droops to a level below Vc, the COMP signal can indicate that the overcurrent condition is no longer present and controller 130 can turn on MOSFET 104H and switches 304, 306 to continue driving MOSFET 104H and to monitor drive current IQ. In one embodiment, the time in which controller 130 turns off MOSFET 104H in response to the detection of overcurrent condition can be dependent on the capacitance value of C1 and the resistance value of R1.

Figure 4:
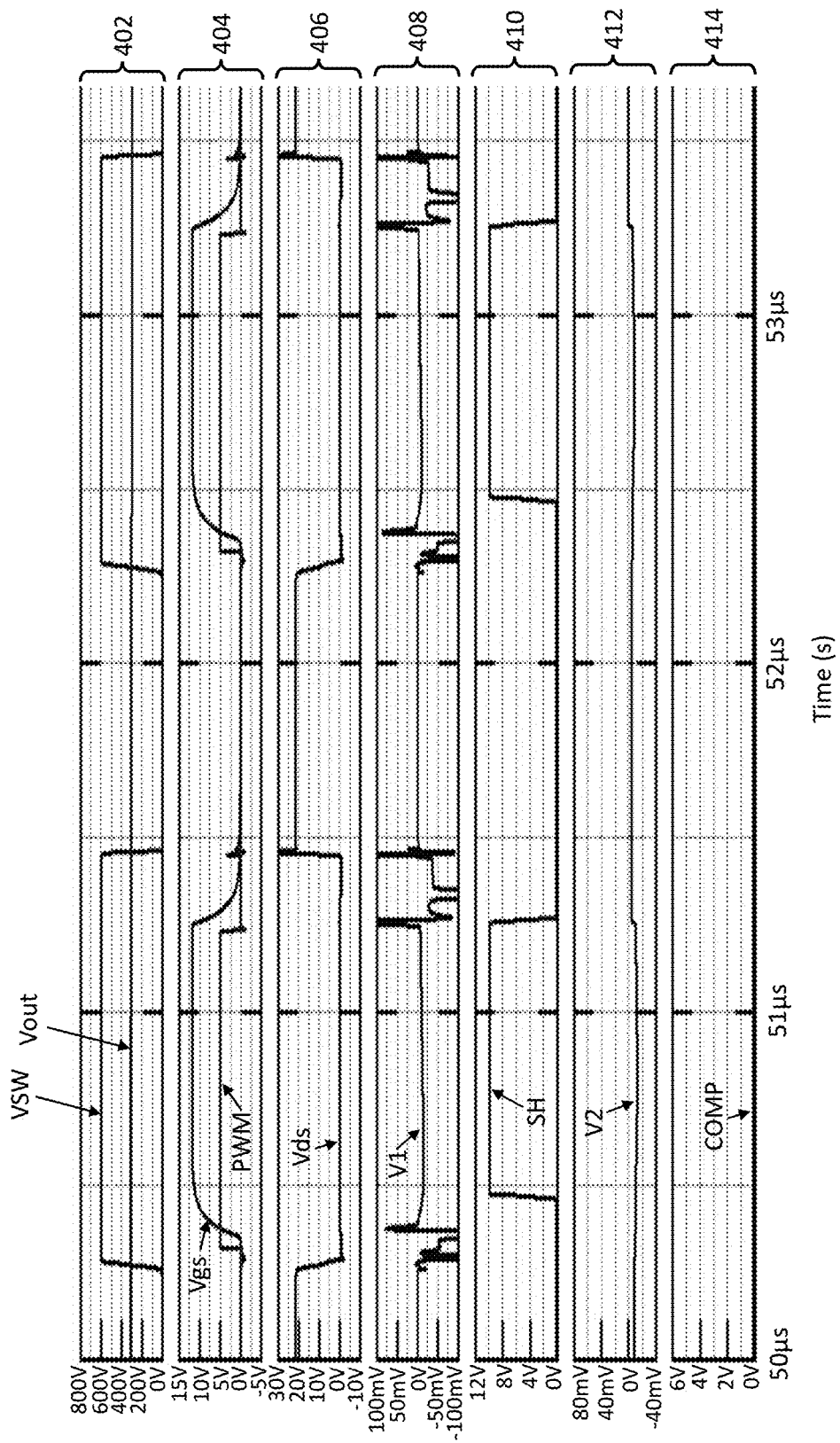
FIG. 4 is a diagram showing waveforms from an implementation of half bridge overcurrent protection where overcurrent condition is not detected in a step down converter in one embodiment.

FIG. 4 is a diagram showing waveforms from an implementation of half bridge overcurrent protection where overcurrent condition is not detected in a step down converter in one embodiment. Descriptions of FIG. 4 can reference components in FIG. 1 to FIG. 3. FIG. 4 corresponds to a scenario where overcurrent protection circuit 120 is monitoring a high-side FET of a buck converter, such as MOSFET 104H. Further, FIG. 4 corresponds to a scenario where overcurrent condition does not occur.

The waveforms in FIG. 4 are results from using an input voltage Vin of 600V, switch frequency of 500 kilohertz (KHz), duty cycle of 50%, inductance L of 80 microhenries (μH), output capacitance Cout of 1 microfarad (F) and load resistance RL of 300 ohms. Waveforms 402 are waveforms of VSW and Vout of the voltage converter (e.g., buck converter) shown in FIG. 3. Since the example shown in FIG. 4 corresponds to a scenario where overcurrent condition does not occur, Vout appears as a constant voltage such as approximately 300V. Waveforms 404 are waveforms of the PWM control signal being used for driving MOSFET 104H and the gate-source voltage Vgs of MOSFET 104H. In an aspect, Vgs rising edge can occur after MOSFET 104H is turned on or after rising ringing noise and the PWM control signal can turn off MOSFET 104H before falling ringing noise. A waveform 406 shows the drain-source voltage Vds of MOSFET 104H.

Waveform 408 is a waveform of the voltage V1 sampled by MOSFET 302 (or first sample and hold circuit) and can include switching noise resulting from the PWM control signal switching MOSFET 104H. Waveform 410 is a waveform of the control signal SH that can control sampling times of sample and hold circuit 303. Waveform 412 is a waveform of the voltage V2 sampled and held by sample and hold circuit 303. When control signal SH is high, MOSFET 302 can sample V1, and sample and hold circuit 303 can hold the sampled voltage as voltage V2. As shown by waveforms 408, 410 and 412, the timing of control signal SH can be controlled (e.g., by controller 130) such that noises in waveform 408 of V1 are not being sampled and held, as shown in waveform 412. In one embodiment, controller 130 can generate the control signal SH based on delayed rising edge of Vgs and falling edge of the PWM control signal, such as pushing SH to high at the rising edge of Vgs and pulling SH low at the falling edge of PWM. By way of example, if threshold voltage Vc is set to 80 mV, V2 in waveform 412 does not exceed 80 mV and thus, overcurrent condition does not occur. The absence of overcurrent condition is shown by the waveform 414 of COMP signal, where the COMP signal stays at zero in waveform 414.

Figure 5:
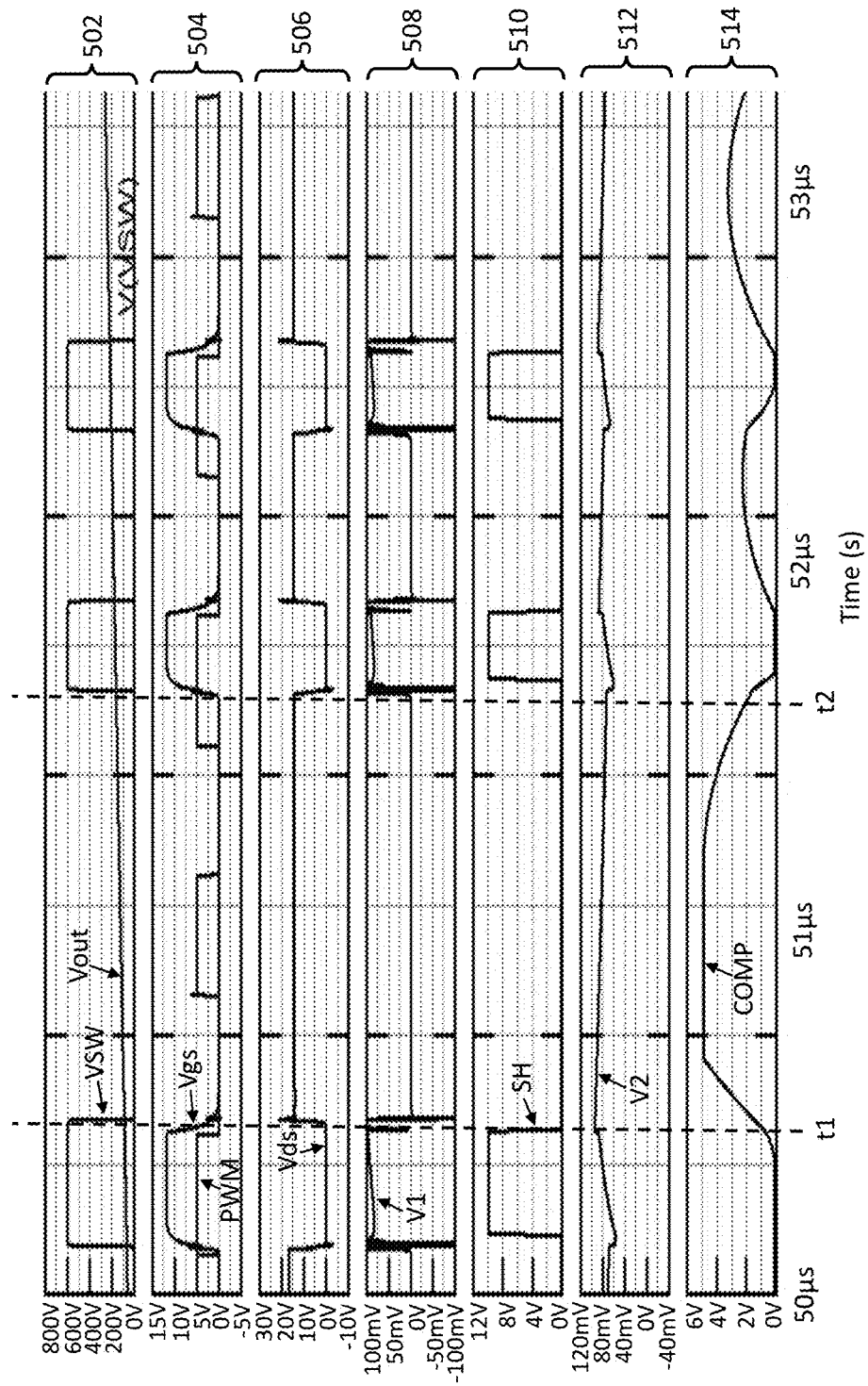
FIG. 5 is a diagram showing waveforms from an implementation of half bridge overcurrent protection where overcurrent condition is detected in a step down converter in one embodiment.

FIG. 5 is a diagram showing waveforms from an implementation of half bridge overcurrent protection where overcurrent condition is detected in a step down converter in one embodiment. Descriptions of FIG. 5 can reference components in FIG. 1 to FIG. 3. FIG. 5 corresponds to a scenario where overcurrent protection circuit 120 is monitoring a high-side FET of a buck converter, such as MOSFET 104H. Further, FIG. 5 corresponds to a scenario where overcurrent condition occurs.

The waveforms in FIG. 5 are results from using an input voltage Vin of 600V, switch frequency of 500 kilohertz (KHz), duty cycle of 50%, inductance L of 80 microhenries (H), output capacitance Cout of 1 microfarad (F) and load resistance RL of 300 ohms. Waveforms 502 are waveforms of VSW and Vout of the voltage converter (e.g., buck converter) shown in FIG. 3. Since the example shown in FIG. 5 corresponds to a scenario where overcurrent condition occurs, Vout is not a constant voltage and increases in response to the occurrence of the overcurrent condition. Waveforms 504 are waveforms of the PWM control signal being used for driving MOSFET 104H and the gate-source voltage Vgs of MOSFET 104H. In an aspect, Vgs rising edge can occur after MOSFET 104H is turned on or after rising ringing noise and the PWM control signal can turn off MOSFET 104H before falling ringing noise. A waveform 506 shows the drain-source voltage Vds of MOSFET 104H.

Waveform 508 is a waveform of the voltage V1 sampled by MOSFET 302 (or first sample and hold circuit) and can include switching noise resulting from the PWM control signal switching MOSFET 104H. Waveform 510 is a waveform of the control signal SH that can control sampling times of sample and hold circuit 303. Waveform 512 is a waveform of the voltage V2 sampled and held by sample and hold circuit 303. When control signal SH is high, MOSFET 302 can sample V1, and sample and hold circuit 303 can hold the sampled voltage as voltage V2. As shown by waveforms 508, 510 and 512, the timing of control signal SH can be controlled (e.g., by controller 130) such that noises in waveform 508 of V1 are not being sampled and held, as shown in waveform 512. In one embodiment, controller 130 can generate the control signal SH based on delayed rising edge of Vgs and falling edge of the PWM control signal, such as pushing SH to high at the rising edge of Vgs and pulling SH low at the falling edge of PWM. By way of example, if threshold voltage Vc is set to 80 mV, at approximately time t1, V2 can exceed Vc and the COMP signal can increase. In response to COMP signal increasing, controller 130 can determine that overcurrent condition has occurred and stop driving MOSFET 104H, as shown by Vgs being maintained at zero in waveform 504 until time t2. Further, as shown in waveform 512, the decay circuit formed by C1 and R1 can gradually decrease the voltage V2 being held until time t2. At time t2, as the COMP signal reaches zero or approaches zero, controller 130 can begin switching MOSFET 104H again.

Figure 6:
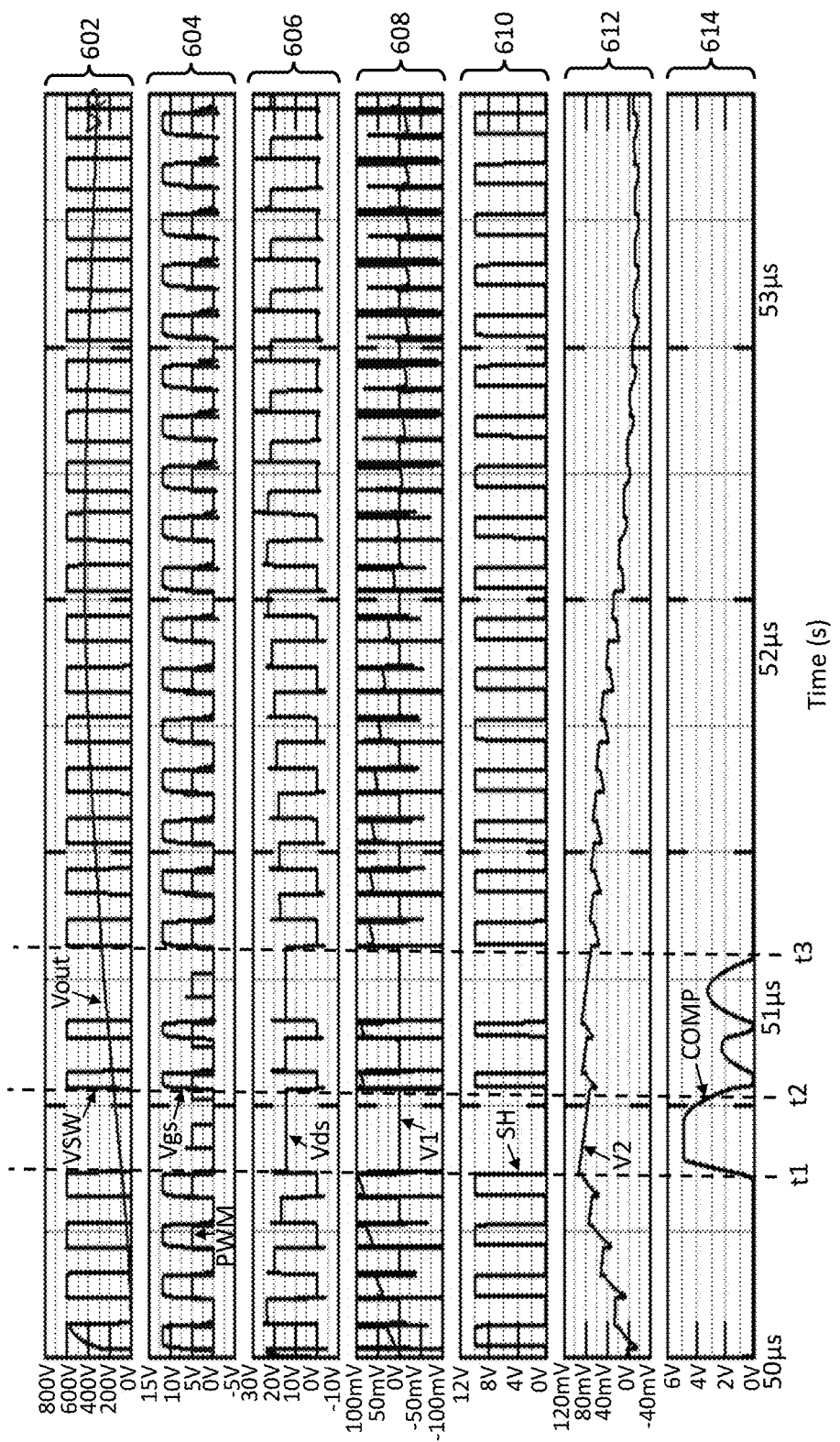
FIG. 6 is a diagram showing waveforms from an implementation of half bridge overcurrent protection to detect and stabilize overcurrent condition in a step down converter in one embodiment.

FIG. 6 is a diagram showing waveforms from an implementation of half bridge overcurrent protection to detect and stabilize overcurrent condition in a step down converter in one embodiment. Descriptions of FIG. 6 can reference components in FIG. 1 to FIG. 3. FIG. 6 corresponds to a scenario where overcurrent protection circuit 120 is monitoring a high-side FET of a buck converter, such as MOSFET 104H. Further, FIG. 6 corresponds to a scenario where an overcurrent condition is detected at a time t1 and stabilized at a time t3.

The waveforms in FIG. 6 are results from using an input voltage Vin of 600V, switch frequency of 500 kilohertz (KHz), duty cycle of 50%, inductance L of 80 microhenries (pH), output capacitance Cout of 1 microfarad (F) and load resistance RL of 300 ohms. Waveforms 602 are waveforms of VSW and Vout of the voltage converter (e.g., buck converter) shown in FIG. 3. Waveforms 604 are waveforms of the PWM control signal being used for driving MOSFET 104H and the gate-source voltage Vgs of MOSFET 104H. In an aspect, Vgs rising edge can occur after MOSFET 104H is turned on or after rising ringing noise and the PWM control signal can turn off MOSFET 104H before falling ringing noise. A waveform 606 shows the drain-source voltage Vds of MOSFET 104H.

Waveform 608 is a waveform of the voltage V1 sampled by MOSFET 302 (or first sample and hold circuit) and can include switching noise resulting from the PWM control signal switching MOSFET 104H. Waveform 610 is a waveform of the control signal SH that can control sampling times of sample and hold circuit 303. Waveform 612 is a waveform of the voltage V2 sampled and held by sample and hold circuit 303. When control signal SH is high, MOSFET 302 can sample V1, and sample and hold circuit 303 can hold the sampled voltage as voltage V2. As shown by waveforms 608, 610 and 612, the timing of control signal SH can be controlled (e.g., by controller 130) such that noises in waveform 608 of V1 are not being sampled and held, as shown in waveform 612. In one embodiment, controller 130 can generate the control signal SH based on delayed rising edge of Vgs and falling edge of the PWM control signal, such as pushing SH to high at the rising edge of Vgs and pulling SH low at the falling edge of PWM. By way of example, if threshold voltage Vc is set to 80 mV, at approximately time t1, V2 can exceed Vc and the COMP signal can increase.

In response to COMP signal increasing, controller 130 can determine that overcurrent condition has occurred and stop driving MOSFET 104H, as shown by Vgs being maintained at zero in waveform 604 until time t2. As shown in waveform 612, the decay circuit formed by C1 and R1 can gradually decrease the voltage V2 being held until time t2. At time t2, the overcurrent condition can be detected again as shown by an increase in the COMP signal and controller 130 can stop driving MOSFET 104H until a time t3. After time t3, the voltage converter stabilizes and overcurrent condition is no longer detected. Further, the output voltage Vout is not constant and increases between times t1 to t3, where multiple instances of overcurrent condition are detected. After time t3, the output voltage Vout becomes constant at approximately 300V and the voltage converter is stabilized.

For the example shown in FIG. 6, if MOSFET 104H has an RDS(on) of 5 milli-ohms, the saturation Vds is being kept below 80 mV and drain-source current Ids is being kept below 16 amperes (A). In an aspect, the load current (e.g., current being drawn by load RL) can be 10 A, which is under 16 A. However, a combination of various currents, such as the output ripple capacitor charging current, load current and ripple current, can cause the current to exceed 16 A. The currents contributing to the overcurrent condition can be unpredictable, thus the overcurrent protection circuit 120 can provide a cycle-by-cycle monitoring to alleviate the overcurrent conditions.

Figure 7:
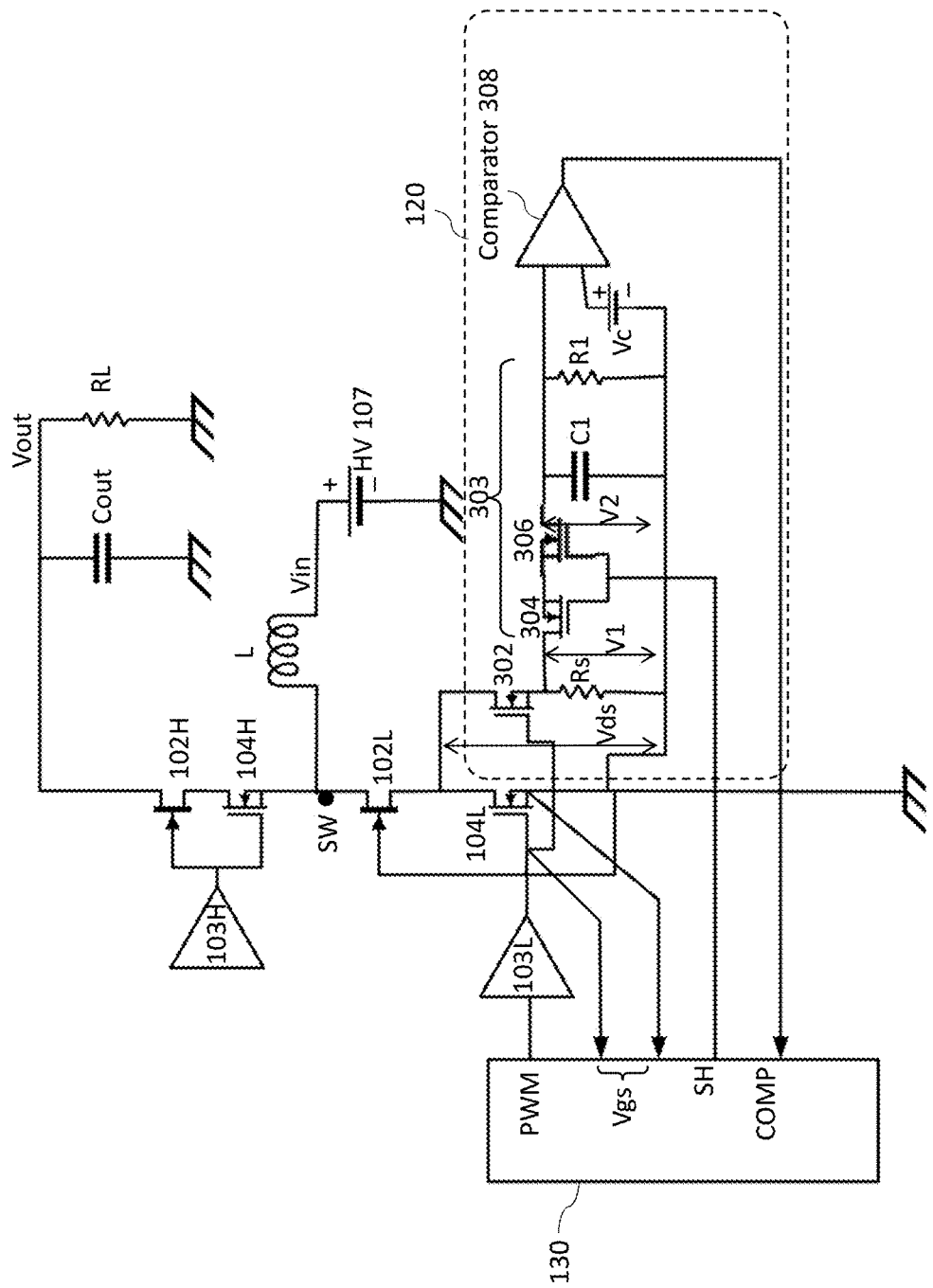
FIG. 7 is a diagram showing another implementation of half bridge overcurrent protection in one embodiment.

FIG. 7 is a diagram showing another implementation of half bridge overcurrent protection in one embodiment. FIG. 7 also shows an embodiment where overcurrent protection circuit 120 is implemented for a step up converter, or a boost converter, such as voltage converter 200 shown in FIG. 2. As shown in FIG. 2, WBG device 102L and MOSFET 104L forms hybrid switching device 105L. WBG device 102L can function as a high voltage blocker for hybrid switching device 105L and ON/OFF switching of hybrid switching device 105L is controlled by MOSFET 104L. When MOSFET 104L is turned on, hybrid switching device 105L is also turned on and a drain-source voltage Vds of MOSFET 104L is a product of drain-source current Ids of MOSFET 104L and a drain-source on resistance (RDS(on)) of MOSFET 104L (e.g., Vds=Ids×RDS(on)). In one embodiment, Vds can be several tens of millivolts (mV). In one embodiment, when MOSFET 104L is turned off, the threshold voltage Vth of WBG device 102H can be approximately 15V.

MOSFET 302 can be used for monitoring the ON Vds of MOSFET 104L (e.g., Vds when MOSFET 104L is turned on). The gate of MOSFET 302 is connected to the gate of MOSFET 104L and the output of driver 103L. Thus, when MOSFET 104L is turned on, MOSFET 302 is turned on as well. MOSFET 302 can be parallel to MOSFET 104L, where MOSFET 302 can implement an analog switch for detecting RDS(on) saturation voltage, and for transferring the saturation Vds into voltage V1.

In one embodiment, MOSFET 302 and MOSFET 104L can be mounted on separate dies. In another embodiment, MOSFET 302 and MOSFET 104L can be integrated on the same die. If MOSFET 302 and MOSFET 104L are integrated on the same die, then the detected Vds voltage can be easier to be transferred to V1 without noise voltage generated by high current switching of WBG device 102L and MOSFET 104L. The MOSFET 302 and MOSFET 104L being on different dies or the same die can be dependent on a desired implementation of voltage converter 200.

Sense resistor Rs can be connected between the source of MOSFET 302 and switch node SW. Sense resistor Rs can receive the saturation Vds at MOSFET 302 to a voltage V1 as $1^{st}$ Sample and Hold circuit. In an aspect, the voltage V1 can be the ON Vds voltage of MOSFET 104L (e.g., several tens of mV) without the OFF Vds voltage (e.g., 15V). Switch 304 can be connected to the source of MOSFET 302 and switch 306 can be connected between switch 304 and capacitor C1. Switches 304, 306, capacitor C1 and resistor R1 can form a second sample and hold circuit 303.

In an aspect, the voltage V1 can include switching noise produced from the transition of MOSFET 104L from an off state to an on state. After MOSFET 302 sampled V1, the sample and hold circuit 303 can perform a second sampling to sample a voltage V2. In one embodiment, the sample timing of V1 (e.g., switching times of MOSFET 302 being controlled by controller 130) can control switches 304 and 306 in sample and hold circuit 303 to transfer V1 to V2 as a hold voltage. This hold voltage can represent an ON current of MOSFET 104L and WBG device 102L. Sampling of the voltage V2 can reject the switching noise present in the voltage V1 such that the sampled voltage V2 can have the same voltage as V1 without switching noise. MOSFET 302 and the sample and hold circuit 303 can perform double sampling that includes a first sampling of V1 and a second sampling of V2. The sample and hold circuit 303 can be controlled by controller 130. Switches 304 and 306 can be various types of switches. In one embodiment, switches 304, 306 being connected back to back in sample and hold circuit 303 can eliminate the current path formed through the body diodes of switches 304, 306.

In one embodiment, switches 304, 306 can be MOSFETs or WBG devices, and controller 130 can send a control signal labeled as SH to the gates of switches 304, 306 to turn on or turn off switches 304, 306. In one embodiment, feedback lines can connect the gate and source of MOSFET 104L to controller 130 such that controller 130 can measure the gate-source voltage Vgs of MOSFET 104L. The gate-source voltage Vgs measured by controller 130 can indicate whether MOSFET 104L is turned on or turned off. In response to controller 130 measuring Vgs and the measured Vgs indicates that MOSFET 104L is turned on, controller 130 can send control signal SH to turn on switches 304 and 306.

Voltage V2 and predefined threshold voltage Vc can be inputted into a comparator 308. Comparator 308 can output a signal COMP to controller 130. In one embodiment, the signal COMP can be a binary signal there a first binary value (e.g., binary zero) can indicate V2 is less than Vc and a second binary value (e.g., binary one) can indicate V2 is greater than Vc. By way of example, when RDS(on) of MOSFET 104L is divided by the predefined threshold voltage Vc (e.g., Vc/RDS(on)), the dividend can be a predefined threshold current that can be compared with drive current IQ to determine whether there is an overcurrent condition. Changes to Vc can change the predefined current threshold. Also, when RDS(on) of MOSFET 104L is divided by V2 (e.g., V2/RDS(on)), the dividend can be the drive current IQ. Therefore, V2 being less than Vc can indicate that the drive current IQ is less than a predefined current threshold and thus there is no overcurrent condition. V2 being greater than Vc can indicate that the drive current IQ is greater than the predefined current threshold and thus an overcurrent condition has occurred.

In response to V2 being greater than Vc indicating that the overcurrent condition has occurred, controller 130 can turn off MOSFET 104L, switches 304, 306 to hold the sampled voltage V2 between switch 306 and comparator 308. The capacitor C1 and resistor R1 can form a decay circuit that gradually decreases the voltage V2 being held. As the voltage V2 gradually droops to a level below Vc, the COMP signal can indicate that the overcurrent condition is no longer present. Controller 130 can turn on MOSFET 104L and switches 304, 306 to continue driving MOSFET 104L and to monitor drive current IQ. In one embodiment, the time in which controller 130 turns off MOSFET 104L in response to the detection of overcurrent condition can be dependent on the capacitance value of C1 and the resistance value of R1.

Figure 8:
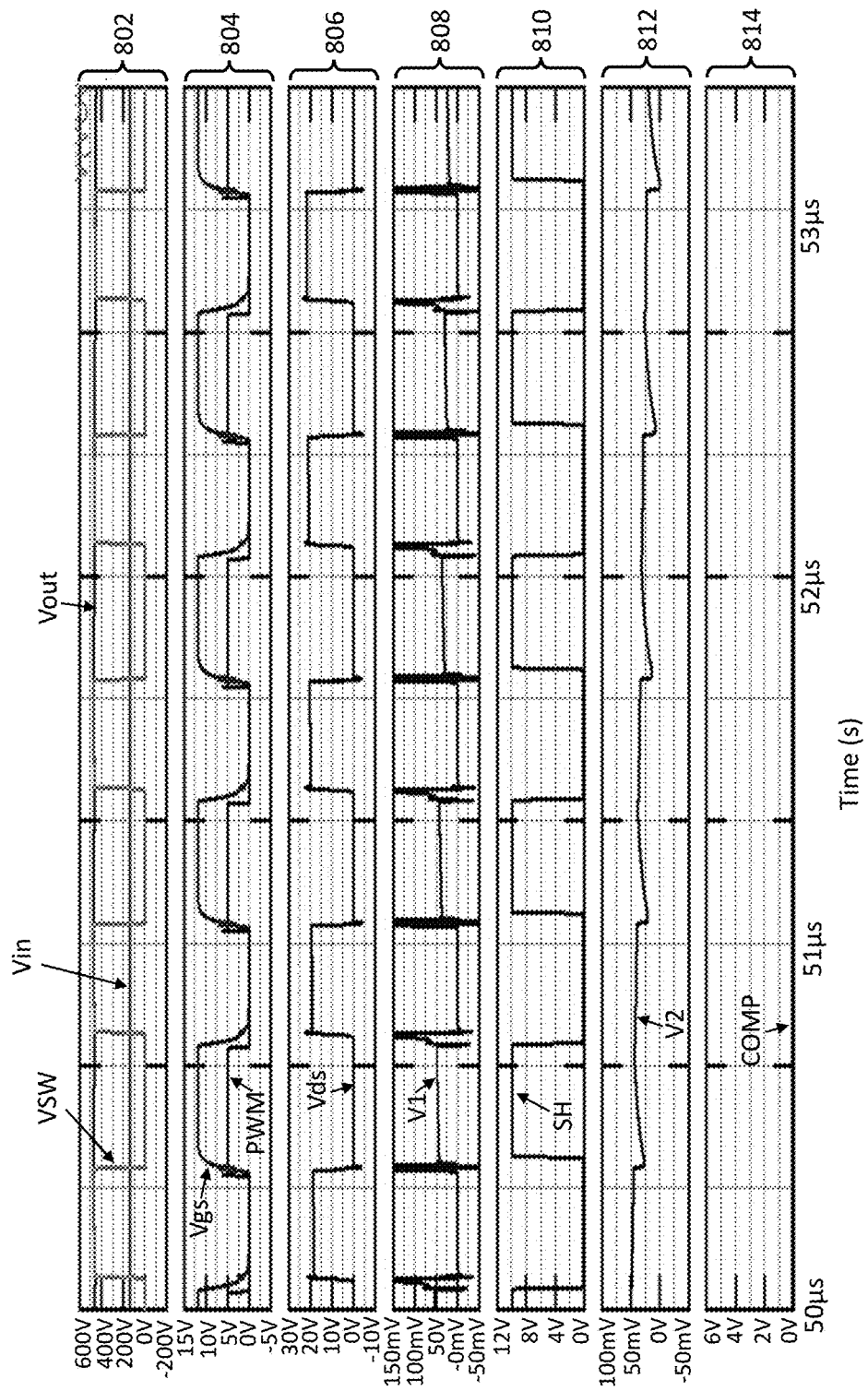
FIG. 8 is a diagram showing waveforms from an implementation of half bridge overcurrent protection where overcurrent condition is not detected in a step up converter in one embodiment.

FIG. 8 is a diagram showing waveforms from an implementation of half bridge overcurrent protection where overcurrent condition is not detected in a step up converter in one embodiment. Descriptions of FIG. 8 can reference components in FIG. 1 to FIG. 3 and FIG. 7. FIG. 8 corresponds to a scenario where overcurrent protection circuit 120 is monitoring a low-side FET of a boost converter, such as MOSFET 104L. Further, FIG. 8 corresponds to a scenario where overcurrent condition does not occur.

The waveforms in FIG. 8 are results from using an input voltage Vin of 140V, switch frequency of 500 kilohertz (KHz), duty cycle of 35%, inductance L of 80 microhenries (H), output capacitance Cout of 0.47 microfarad (F) and load resistance RL of 100 ohms. Waveforms 802 are waveforms of VSW and Vout of the voltage converter (e.g., boost converter) shown in FIG. 3. Since the example shown in FIG. 8 corresponds to a scenario where overcurrent condition does not occur, Vout appears as a constant voltage such as approximately 800V. Waveforms 804 are waveforms of the PWM control signal being used for driving MOSFET 104L and the gate-source voltage Vgs of MOSFET 104L. In an aspect, Vgs rising edge can occur after MOSFET 104H is turned on or after rising ringing noise and the PWM control signal can turn off MOSFET 104L before falling ringing noise. A waveform 806 shows the drain-source voltage Vds of MOSFET 104L.

Waveform 808 is a waveform of the voltage V1 sampled by sample and hold circuit 303 and can include switching noise resulting from the PWM control signal switching MOSFET 104L. Waveform 810 is a waveform of the control signal SH that can control sampling times of sample and hold circuit 303. Waveform 812 is a waveform of the voltage V2 sampled and held by sample and hold circuit 303. When control signal SH is high, MOSFET 302 can sample V1, and sample and hold circuit 303 can hold the sampled voltage as voltage V2. As shown by waveforms 808, 810 and 812, the timing of control signal SH can be controlled (e.g., by controller 130) such that noises in waveform 808 of V1 are not being sampled and held, as shown in waveform 812. In one embodiment, controller 130 can generate the control signal SH based on delayed rising edge of Vgs and falling edge of the PWM control signal, such as pushing SH to high at the rising edge of Vgs and pulling SH low at the falling edge of PWM. By way of example, if threshold voltage Vc is set to 80 mV, V2 in waveform 812 does not exceed 80 mV and thus, overcurrent condition does not occur. The absence of overcurrent condition is shown by the waveform 814 of COMP signal, where the COMP signal stays at zero in waveform 814.

Figure 9:
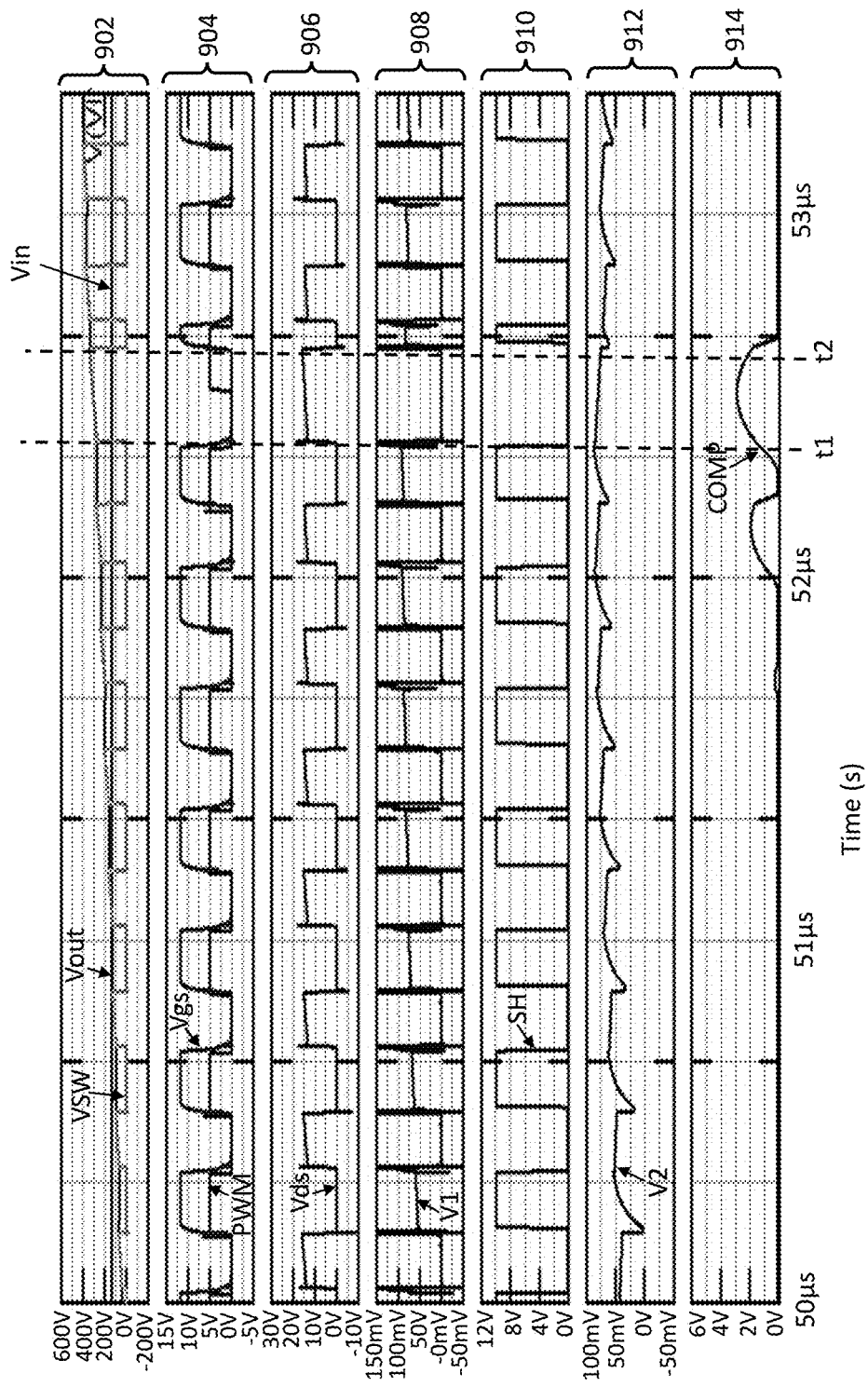
FIG. 9 is a diagram showing waveforms from an implementation of half bridge overcurrent protection where overcurrent condition is detected in a step down converter in one embodiment.

FIG. 9 is a diagram showing waveforms from an implementation of half bridge overcurrent protection where overcurrent condition is detected in a step down converter in one embodiment. Descriptions of FIG. 9 can reference components in FIG. 1 to FIG. 3 and FIG. 7. FIG. 9 corresponds to a scenario where overcurrent protection circuit 120 is monitoring a low-side FET of a boost converter, such as MOSFET 104L. Further, FIG. 9 corresponds to a scenario where overcurrent condition occurs.

The waveforms in FIG. 9 are results from using an input voltage Vin of 140V, switch frequency of 500 kilohertz (KHz), duty cycle of 35%, inductance L of 80 microhenries (H), output capacitance Cout of 0.47 microfarad (F) and load resistance RL of 100 ohms. Waveforms 902 are waveforms of VSW and Vout of the voltage converter (e.g., boost converter) shown in FIG. 3. Since the example shown in FIG. 9 corresponds to a scenario where overcurrent condition occurs, Vout is not a constant voltage and increases in response to the occurrence of the overcurrent condition. Waveforms 904 are waveforms of the PWM control signal being used for driving MOSFET 104L and the gate-source voltage Vgs of MOSFET 104L. In an aspect, Vgs rising edge can occur after MOSFET 104H is turned on or after rising ringing noise and the PWM control signal can turn off MOSFET 104L before falling ringing noise. A waveform 906 shows the drain-source voltage Vds of MOSFET 104L.

Waveform 908 is a waveform of the voltage V1 sampled by MOSFET 302 and can include switching noise resulting from the PWM control signal switching MOSFET 104L. Waveform 910 is a waveform of the control signal SH that can control sampling times of sample and hold circuit 303. Waveform 912 is a waveform of the voltage V2 sampled and held by sample and hold circuit 303. When control signal SH is high, MOSFET 302 can sample V1, and sample and hold circuit 303 can hold the sampled voltage as voltage V2. As shown by waveforms 908, 910 and 912, the timing of control signal SH can be controlled (e.g., by controller 130) such that noises in waveform 908 of V1 are not being sampled and held, as shown in waveform 912. In one embodiment, controller 130 can generate the control signal SH based on delayed rising edge of Vgs and falling edge of the PWM control signal, such as pushing SH to high at the rising edge of Vgs and pulling SH low at the falling edge of PWM. By way of example, if threshold voltage Vc is set to 60 mV, at approximately time t1, V2 can exceed Vc and the COMP signal can increase. In response to COMP signal increasing, controller 130 can determine that overcurrent condition has occurred and stop driving MOSFET 104L, as shown by Vgs being maintained at zero in waveform 904 until time t2. Further, as shown in waveform 912, the decay circuit formed by C1 and R1 can gradually decrease the voltage V2 being held until time t2. At time t2, as the COMP signal reaches zero or approaches zero, controller 130 can begin switching MOSFET 104L again.

Figure 10:
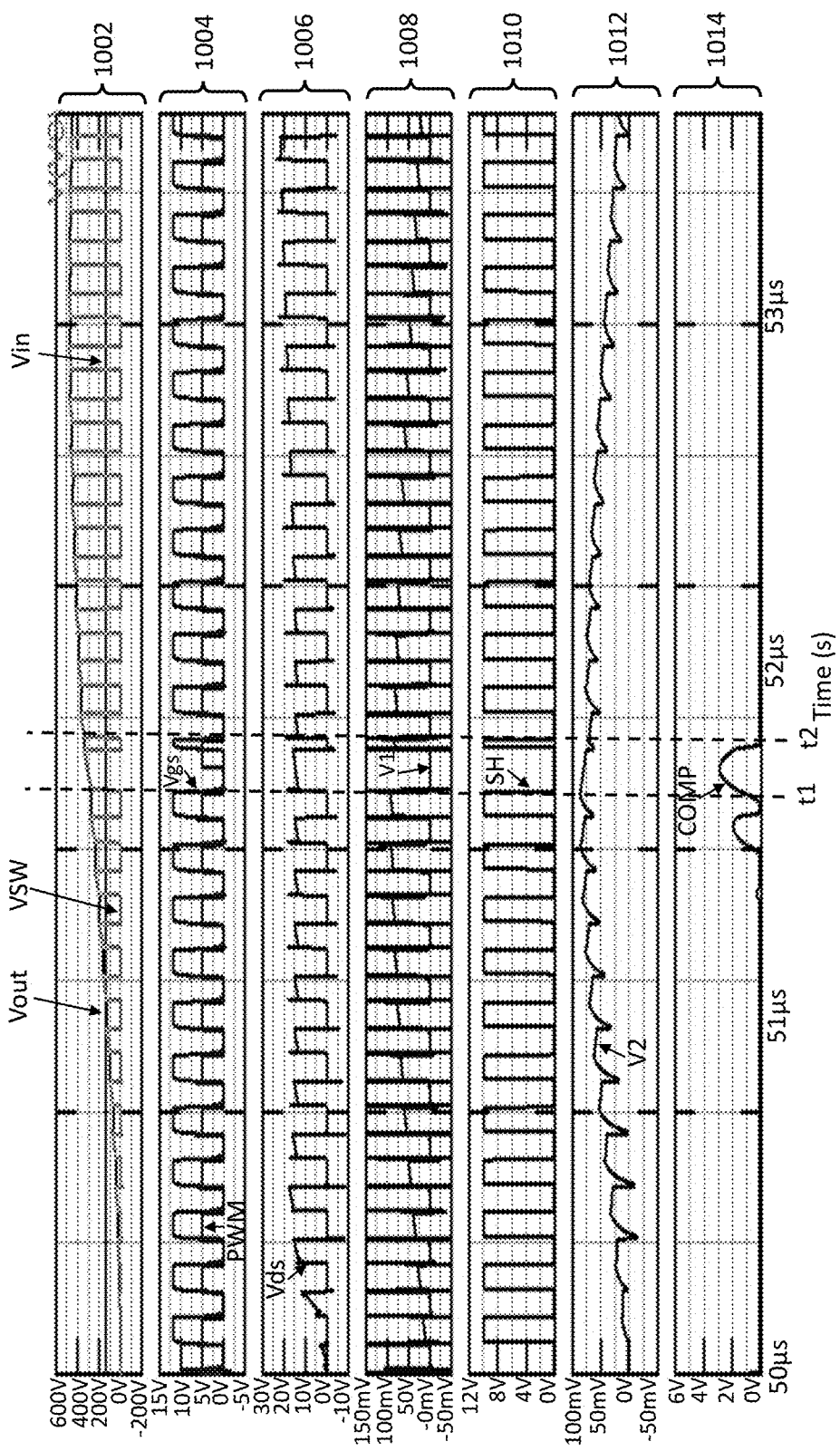
FIG. 10 is a diagram showing waveforms from an implementation of half bridge overcurrent protection to detect and stabilize overcurrent condition in a step up converter in one embodiment.

FIG. 10 is a diagram showing waveforms from an implementation of half bridge overcurrent protection to detect and stabilize overcurrent condition in a step up converter in one embodiment. Descriptions of FIG. 10 can reference components in FIG. 1 to FIG. 3 and FIG. 7. FIG. 10 corresponds to a scenario where overcurrent protection circuit 120 is monitoring a low-side FET of a boost converter, such as MOSFET 104H. Further, FIG. 10 corresponds to a scenario where an overcurrent condition is detected at a time t1 and stabilized at a time t2.

The waveforms in FIG. 9 are results from using an input voltage Vin of 140V, switch frequency of 500 kilohertz (KHz), duty cycle of 35%, inductance L of 80 microhenries (H), output capacitance Cout of 0.47 microfarad (F) and load resistance RL of 100 ohms. Waveforms 1002 are waveforms of VSW and Vout of the voltage converter (e.g., boost converter) shown in FIG. 3. Waveforms 1004 are waveforms of the PWM control signal being used for driving MOSFET 104L and the gate-source voltage Vgs of MOSFET 104L. In an aspect, Vgs rising edge can occur after MOSFET 104H is turned on or after rising ringing noise and the PWM control signal can turn off MOSFET 104L before falling ringing noise. A waveform 1006 shows the drain-source voltage Vds of MOSFET 104L.

Waveform 1008 is a waveform of the voltage V1 sampled by MOSFET 302 and can include switching noise resulting from the PWM control signal switching MOSFET 104L. Waveform 1010 is a waveform of the control signal SH that can control sampling times of sample and hold circuit 303. Waveform 1012 is a waveform of the voltage V2 sampled and held by sample and hold circuit 303. When control signal SH is high, MOSFET 302 can sampled V1, and sample and hold circuit 303 can hold the sampled voltage as voltage V2. As shown by waveforms 1008, 1010 and 1012, the timing of control signal SH can be controlled (e.g., by controller 130) such that noises in waveform 1008 of V1 are not being sampled and held, as shown in waveform 1012. In one embodiment, controller 130 can generate the control signal SH based on delayed rising edge of Vgs and falling edge of the PWM control signal, such as pushing SH to high at the rising edge of Vgs and pulling SH low at the falling edge of PWM. By way of example, if threshold voltage Vc is set to 60 mV, at approximately time t1, V2 can exceed Vc and the COMP signal can increase.

In response to COMP signal increasing, controller 130 can determine that overcurrent condition has occurred and stop driving MOSFET 104L, as shown by Vgs being maintained at zero in waveform 1004 until time t2. As shown in waveform 1012, the decay circuit formed by C1 and R1 can gradually decrease the voltage V2 being held until time t2. At time t2, the overcurrent condition can be detected again as shown by an increase in the COMP signal and controller 130 can stop driving MOSFET 104L until a time t3. After time t3, the voltage converter stabilizes and overcurrent condition is no longer detected. Further, the output voltage Vout is not constant and increases between times t1 to t3, where multiple instances of overcurrent condition are detected. After time t3, the output voltage Vout becomes constant at approximately 400V and the voltage converter is stabilized.

For the example shown in FIG. 10, if MOSFET 104L has an RDS(on) of 5 milli-ohms, the saturation Vds is being kept below 60 mV and drain-source current Ids is being kept below 12 amperes (A). In an aspect, the load current (e.g., current being drawn by load RL) can be 10 A, which is under 12 A. However, a combination of various currents, such as the output ripple capacitor charging current, load current and ripple current, can cause the current to exceed 12 A. The currents contributing to the overcurrent condition can be unpredictable, thus the overcurrent protection circuit 120 can provide a cycle-by-cycle monitoring to alleviate the overcurrent conditions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
  a half bridge circuit including:
    a first hybrid switching device connected to an input voltage, the first hybrid switching device including a first wide-bandgap (WBG) device and a first field-effect transistor (FET) connected in a cascode arrangement, wherein the first WBG device has a higher breakdown voltage than the first FET and the first WBG device has a larger band gap than the first FET; and
    a second hybrid switching device connected to ground, the second hybrid switching device including a second WBG device and a second FET connected in a cascode arrangement, wherein the second WBG device has a higher breakdown voltage than the second FET and the second WBG device has a larger band gap than the second FET; and
  a circuit connected to one of the first hybrid switching device and the second hybrid switching device, the circuit being configured to:
    monitor a drive current of the half bridge circuit; and
    detect an overcurrent condition of the half bridge circuit based on the monitored drive current.

2. The apparatus of claim 1, wherein:
  the first WBG device and the second WBG device are one of enhancement mode devices and depletion mode devices; and
  the first FET and the second FET are enhancement mode devices.

3. The apparatus of claim 1, wherein the circuit comprises:
  a sense FET connected to one of the first FET and the second FET configured to sample a drain-source voltage of the FET connected to the sense FET;
  a sample and hold circuit configured to remove noise from the sampled drain-source voltage to output a hold voltage; and
  a comparator configured to compare the hold voltage with a predefined threshold voltage, wherein an output of the comparator indicates whether the overcurrent condition is present or absent.

4. The apparatus of claim 3, wherein the sense FET is integrated on the same die as the FET that is connected to the sense FET.

5. The apparatus of claim 3, wherein the circuit further comprises a decay circuit, and in response to a presence of the overcurrent condition, the decay circuit is configured to decrease the sampled drain-source voltage.

6. The apparatus of claim 1, wherein the circuit is connected to the first hybrid switching device in response to the half bridge circuit being part of a buck voltage converter.

7. The apparatus of claim 1, wherein the circuit is connected to the second hybrid switching device in response to the half bridge circuit being part of a boost voltage converter.

8. An apparatus comprising:
  a controller;
  a half bridge circuit including:
    a first hybrid switching device connected to an input voltage, the first hybrid switching device including a first wide-bandgap (WBG) device and a first field-effect transistor (FET) connected in a cascode arrangement, wherein the first WBG device has a higher breakdown voltage than the first FET and the first WBG device has a larger band gap than the first FET; and
    a second hybrid switching device connected to ground, the second hybrid switching device including a second WBG device and a second FET connected in a cascode arrangement, wherein the second WBG device has a higher breakdown voltage than the second FET and the second WBG device has a larger band gap than the second FET; and
  a circuit connected to one of the first hybrid switching device and the second hybrid switching device, the circuit being configured to:
    monitor a drive current of the half bridge circuit;
    generate a signal based on the monitored drive current, wherein the signal indicates whether an overcurrent condition of the half bridge circuit is present or absent; and
    output the signal to the controller,
  the controller being configured to control the half bridge circuit based on the signal.

9. The apparatus of claim 8, wherein:
  the first WBG device and the second WBG device are one of enhancement mode devices and depletion mode devices; and
  the first FET and the second FET are enhancement mode devices.

10. The apparatus of claim 8, wherein the circuit comprises:
  a sense FET connected to one of the first FET and the second FET configured to sample a drain-source voltage of the FET connected to the sense FET;
  a sample and hold circuit configured to remove noise from the sampled drain-source voltage to output a hold voltage; and
  a comparator configured to:
    compare the hold voltage with a predefined threshold voltage; and
    generate the signal that indicates whether the overcurrent condition of the half bridge circuit is present or absent.

11. The apparatus of claim 10, wherein the sense FET is integrated on the same die as the FET that is connected to the sense FET.

12. The apparatus of claim 10, wherein the circuit further comprises a decay circuit, and in response to a presence of the overcurrent condition, the decay circuit is configured to decrease the sampled drain-source voltage.

13. The apparatus of claim 10, wherein the sense FET is connected to the first FET in response to the half bridge circuit being part of a buck voltage converter.

14. The apparatus of claim 10, wherein the sense FET is connected to the second FET in response to the half bridge circuit being part of a boost voltage converter.

15. The apparatus of claim 8, wherein the controller is configured to:
- in response to the signal indicating the overcurrent condition of the half bridge circuit is absent, continue to drive the first hybrid switching device and the second hybrid switching device; and
- in response to the signal indicating the overcurrent condition of the half bridge circuit is present, stop driving the first hybrid switching device and the second hybrid switching device.

16. An apparatus comprising:
- a sense field effect transistor (FET) connected to a FET in a half bridge circuit including a first hybrid switching device and a second hybrid switching device, wherein the first hybrid switching device includes a first wide-bandgap (WBG) device and a first FET connected in a cascode arrangement and the second hybrid switching device includes a second WBG device and a second FET connected in a cascode arrangement;
- a sample and hold circuit configured to:
  - sample a drain-source voltage of the FET; and
  - remove noise from the sampled drain-source voltage to output a hold voltage; and
- a comparator configured to compare the hold voltage with a predefined threshold voltage, wherein an output of the comparator indicates whether a overcurrent condition is present or absent in the half bridge circuit.

17. The apparatus of claim 16, wherein the sense FET is connected to the first FET in response to the half bridge circuit being part of a buck voltage converter.

18. The apparatus of claim 16, wherein the sense FET is connected to the second FET in response to the half bridge circuit being part of a boost voltage converter.

19. The apparatus of claim 16, wherein the circuit further comprises a decay circuit, and in response to a presence of the overcurrent condition, the decay circuit is configured to decrease the sampled drain-source voltage.

20. The apparatus of claim 16, wherein the sense FET is integrated on the same die as the FET that is connected to the sense FET.

* * * * *